(12) United States Patent
Sumino

(10) Patent No.: US 7,484,147 B2
(45) Date of Patent: Jan. 27, 2009

(54) SEMICONDUCTOR INTEGRATED CIRCUIT

(75) Inventor: Kiwamu Sumino, Miyagi (JP)

(73) Assignee: Freescale Semiconductor, Inc, Austin, TX (US)

( * ) Notice: Subject to any disclaimer, the term of this patent is extended or adjusted under 35 U.S.C. 154(b) by 430 days.

(21) Appl. No.: 11/503,649

(22) Filed: Aug. 14, 2006

(65) Prior Publication Data

US 2007/0047346 A1    Mar. 1, 2007

(30) Foreign Application Priority Data

Aug. 23, 2005    (JP)    ............................. 2005-241622

(51) Int. Cl.
G01R 31/28    (2006.01)
(52) U.S. Cl. .................................. 714/724
(58) Field of Classification Search ........................ None
See application file for complete search history.

(56) References Cited

U.S. PATENT DOCUMENTS 6,219,289 B1 *   4/2001   Satoh et al. .................. 365/201

6,973,404 B1 *  12/2005   Krech et al. ................. 702/117
2004/0107397 A1 *  6/2004   Holman ...................... 714/752

FOREIGN PATENT DOCUMENTS

JP    2003-178596    6/2003

* cited by examiner

*Primary Examiner*—John P Trimmings
(74) *Attorney, Agent, or Firm*—Charles Bergere

(57) ABSTRACT

A semiconductor integrated circuit for intentionally and flexibly changing a monitoring subject bit if debugging is performed during software processing when a status change occurs. A replacement data register and a comparison address register, which are settable from a microprocessor, determine matching of an address input from the microprocessor and a comparison address value. When the addresses match in a test mode, instead of outputting normal status data, a predetermined value of the replacement data register is output in response to a read request from the microprocessor.

5 Claims, 3 Drawing Sheets

TEN  1 TEST ENABLE BIT
     0 TEST DISABLE

ONCE 1 PERFORM REPLACEMENT OR INVERSION ONLY ONCE
     0 ALWAYS PERFORM REPLACEMENT OR INVERSION

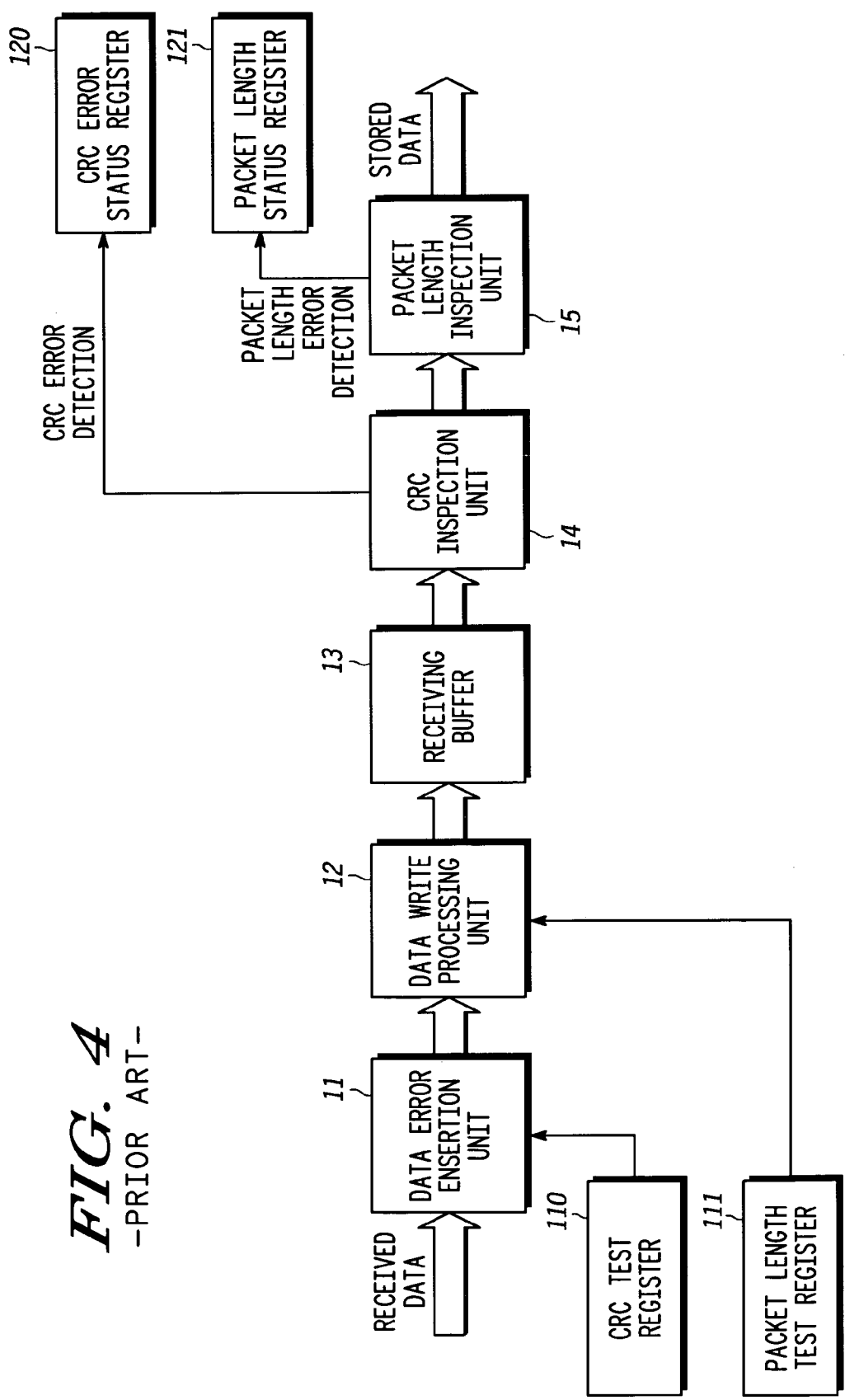
FIG. 4 -PRIOR ART-

SEMICONDUCTOR INTEGRATED CIRCUIT

BACKGROUND OF THE INVENTION

The present invention relates to a semiconductor integrated circuit, and more specifically to a microprocessor and its peripheral integrated circuits.

In an information processing device incorporating a microprocessor, normal and abnormal states of the device are monitored. This is accomplished by monitoring bits in a status register by executing a polling routine or an interrupt routine. One example of a normal state is a state in which a communication buffer is empty. An example of an abnormal state is a state in which there is CRC data or the like in received data. Software processing is performed accordingly based on this monitoring. In this way, debugging is necessary when developing a device, and a change in the status bit caused by an error that should not occur in a normal state must be checked. Therefore, an equivalent register space is prepared in the system memory, and this memory space is assumed to be a status register. The value of the status register is re-written to cause a change in status register in a falsified manner and perform debugging of the monitoring subject.

Japanese Laid-Open Patent Publication No. 2005-006394 describes a technique providing a memory chip for reducing the testing time and testing cost of memory cells. In this technique, a semiconductor memory chip includes a memory array of test memory devices, a pattern generator for providing reference data that is input and stored in the memory array, and a comparator formed on the memory chip to compare the stored data from the memory array with the reference data. The comparator includes a logic circuit for comparing the reference data and the stored data and generating a comparison result that indicates whether the data match, a plurality of latches shifted between first and second states and receiving comparison results from the logic circuit, and registers for storing and outputting the first and second states of the latches to generate test results.

A test circuit such as that shown in FIG. 4 is incorporated in part of a semiconductor integrated circuit to check the legitimacy of a detection function related to abnormal errors. Debugging is performed by partially changing a status bit with this function. The circuit includes a data error insertion unit 11, a data write processing unit 12, a receiving buffer 13, a CRC inspection unit 14, and a packet length inspection unit 15, a CRC test register 110, packet length test register 111, CRC error status register 120, and packet length error status register 121. In the data error insertion unit 11, the data stored in the CRC test register 110 is added to the received data. The data stored in the packet length test register 111 is added in the data write processing unit 12. When a CRC error is detected in the CRC inspection unit 14, the result is stored in the CRC error status register 120. When a packet length error is detected in the packet length inspection unit 15, the result is stored in the packet length error status register 121.

Japanese Laid-Open Patent Publication No. 2003-178596 describes a semiconductor integrated circuit capable of resolving a deficiency quickly and inexpensively even when a bug is found in a final manufacturing stage. The semiconductor integrated circuit includes a ROM for storing a program, a microprocessor for executing a program code read from the ROM, a substitution code register for storing a substitution code that is substituted for the program code, and a substitution address designation register for storing an address substituted for the program code. The comparator compares the read address output to an address bus with the address stored in the substitution address designation register. Based on the comparison result, a selector selects whether to provide the program code executed by the microprocessor from the ROM or from the substitution code register side.

As described above, in a method for temporarily allocating a status register in a memory, it is necessary to perform many program rewrites for software debugging.

Further, there is a possibility of contamination by new bugs when returning to the original state after debugging is completed.

Furthermore, since status changes occur in a system memory, there is a possibility of overlooking problems that occur between the microprocessor and the actual semiconductor integrated circuit. This affects the inspection quality of the hardware and software as a whole. Although test circuits may be prepared for the entire status register space in the semiconductor integrated circuit when a new semiconductor integrated circuit is designed, this would increase the test circuit scale. Further, in the limited register space, much space would be occupied for testing.

SUMMARY OF THE INVENTION

It is an object of the present invention to provide a semiconductor integrated circuit capable of intentionally and flexibly changing a monitoring subject bit during a software debugging process in accordance with a status change in an information processing device incorporating a microprocessor.

One aspect of the present invention is a semiconductor integrated circuit connected to a microprocessor and including an externally settable test mode register, a replacement data register, a mask setting register, and a comparison address register. The semiconductor integrated circuit includes a first selection means for selecting register data recorded in register space based on an input address from the microprocessor, an address comparator for detecting a match between the input address and an address recorded in the comparison address register, and a second selection means for selecting a subject bit with the mask setting register and the replacement data register when a test mode is set by the test mode register and a match detection signal is output from the address comparator, and outputting final register data generated by executing a bit data change operation on normal register data.

Other aspects and advantages of the present invention will become apparent from the following description, taken in conjunction with the accompanying drawings, illustrating by way of example the principles of the invention.

DETAILED DESCRIPTION OF THE DRAWINGS

The invention, together with objects and advantages thereof, may best be understood by reference to the following description of the presently preferred embodiments together with the accompanying drawings in which:

FIG. 4 is a schematic diagram showing function blocks in an integrated circuit of the prior art.

DETAILED DESCRIPTION OF THE PREFERRED EMBODIMENTS

Figure 1:
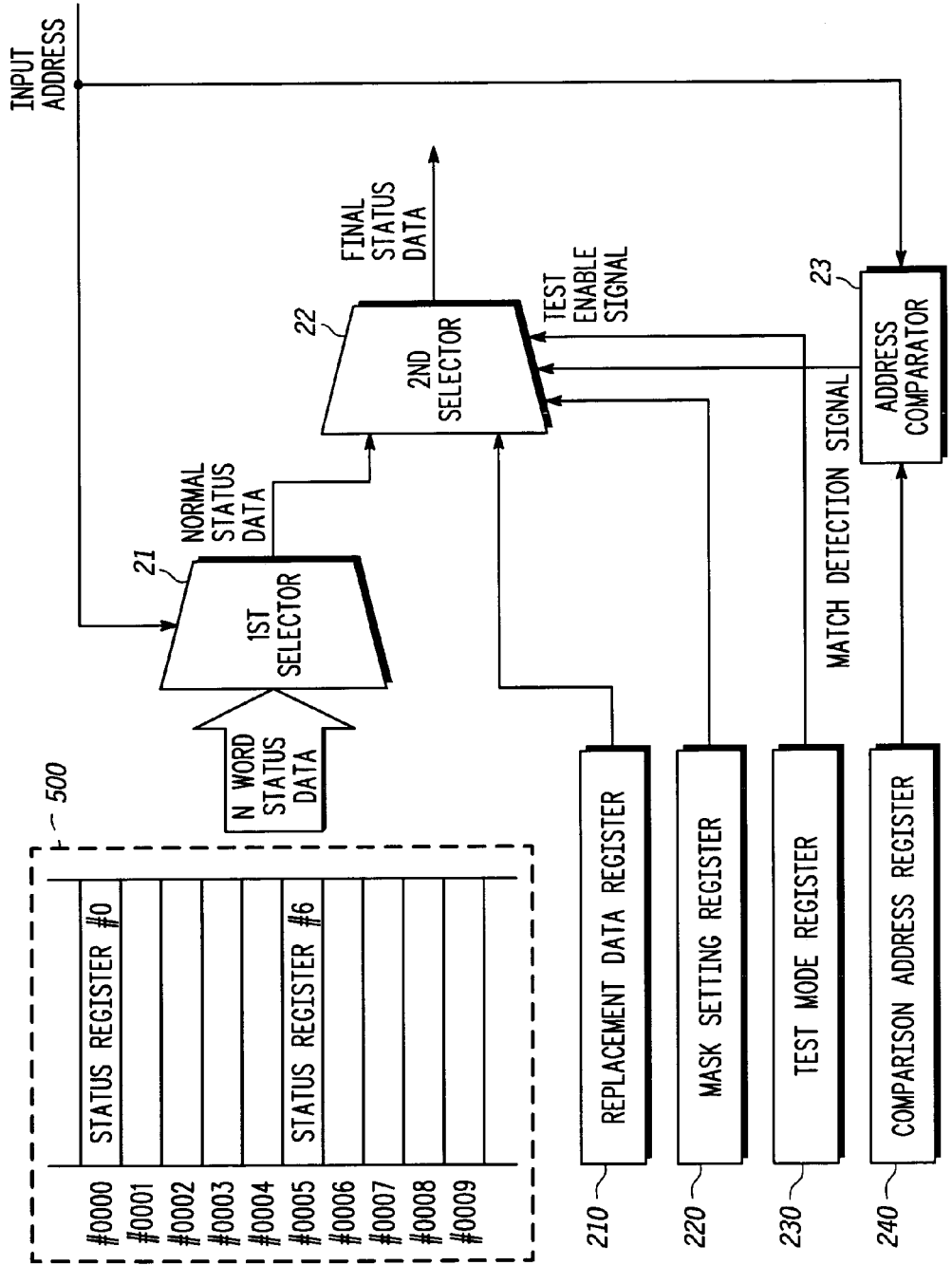
FIG. 1 is a schematic diagram showing a function block according to a preferred embodiment of the present invention.
Figure 2:
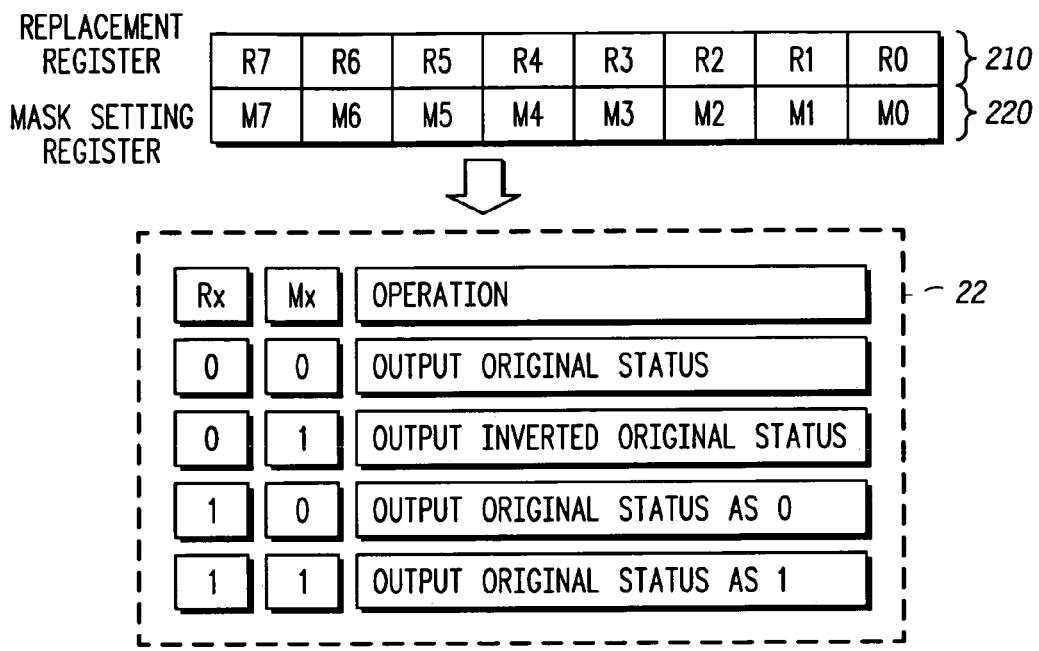
FIG. 2 is a schematic diagram is a schematic diagram showing a replacement data register and a mask setting register.

A semiconductor integrated circuit according to a preferred embodiment of the present invention will now be described with reference to FIGS. 1 and 2. FIG. 1 is a block diagram showing the main parts of the semiconductor integrated circuit. The semiconductor integrated circuit of the preferred embodiment is used, for example, in a control IC that performs various types of electronic controls. The control IC also includes a read only memory (ROM) for recording a control program, and a central processing unit (CPU) for executing the control program.

The semiconductor integrated circuit includes a first selector 21, a second selector 22, an address comparator 23, status register space 500, a replacement data register 210, a mask setting register 220, a test mode register 230, and a comparison address register 240.

The first selector 21, which functions as a first selection means, is connected to an address bus that provided with input addresses. The first selector 21 selects N word status data of the status register space 500 based on the input address. The status register space 500 is a register for setting and displaying the internal state of the microprocessor has sixteen bits in the preferred embodiment.

The first selector 21 provides the acquired N word status data as a normal status signal to the second selector 22, which functions as a second selection means.

The second selector 22 is provided with data from the replacement data register 210, the mask setting register 220, and the test mode register 230. Further, the second selector 22 outputs the final status data. The final status data is output to the microprocessor through a data bus.

The replacement data register 210 stores a bit pattern for replacing normal status data to assume an abnormal state during testing.

The mask setting register 220 determines a mask pattern for designating a bit only when a certain bit is replaced.

The test mode register 230 sets a test enable signal for determining whether or not to replace status data. The test mode is set when predetermined data is input to this register.

The second selector 22 is also connected to the address comparator 23. The address comparator 23 is provided with data from the comparison address register 240 and the input address from the address register.

The comparison address register 240 stores data designating the address of the status register that replaces normal status data.

The address comparator 23 compares the address set in the comparison address register 240 with the address output from the address bus designated by the microprocessor to output a comparison result, which functions as a match detection signal, to the second selector 22.

When receiving a match detection signal, which indicates a match, from the address comparator 23 has been input in the match detection signal, the second selector 22 changes the bit data of the normal register data. Then, the final status data (final register data) generated by the change is output to the microprocessor through a data bus.

Specific examples of the present embodiment will now be described. Here, a certain status bit, for example, LSB (bit j), of the status register #6 in the status register space 500 is the monitoring subject. When changing LSB from "0" to "1", "01h" is written to the replacement data register 210, and bits other than the monitoring subject write is written to "01h" as "ALL0" in the mask setting register. This combination sets bit 0 to "output original status as 1" and sets the other bits to "output original status", as shown in FIG. 2.

Referring to FIG. 1, the subject register is status register #6 of the status register space 500. Thus, he same address "05h" as status register #6 is written to the comparison address register 240.

The mode is then switched to the test mode. The mode is switched to the test mode by writing "01h" to the test mode register 230. In the test mode, when the microprocessor is accessing the register at an address other than address "05h", the first selector 21 selects one piece of word data from the N word status data in accordance with the input address in the same manner as during normal operation. In this case, the address set in the comparison address register 240 differs from the input address. Thus, the match detection signal output from the address comparator 23 does not become active. Therefore, normal status data input from the first selector 21 is also output as final status data in the second selector 22 of the next stage.

When the input address is "05h", the match detection signal from the address comparator 23 becomes active. In this case, the first selector 21 selects status register #6 of which input address is "05h". Then, this data is provided to the second selector 22. Since the match detection signal is active, the second selector 22 replaces the bit data. Specifically, only the LSB bit is "1" in the output from the mask setting register 220. Thus, only the LSB bit of the replacement data register 210 is set as the selection subject. Bits other than the LSB bit are output from the first selector 21 as the selection subject and set as the data for the final status output.

Through these series of operations, only the LSB bit of the status register #6 is replaced with "1".

The subject bit is replaced with "1" in the above description. However, the replacement data register 210 and the set value of the mask setting register 220 shown in FIG. 2 may be combined to make a change in any manner, such as when replacing the subject bit with "0", inverting the original status, or outputting the original status.

The semiconductor integrated circuit of the above embodiment has the advantages described below.

In the preferred embodiment, when the input address differs from the address set in the comparison address register 240, the match detection signal output from the address comparator 23 does not become active. When the input address matches the address set in the comparison address register 240, the match detection signal output from the address comparator 23 becomes active. In this case, the second selector 22 replaces the bit data with the replacement data register 210 and the mask setting register 220. That is, in the test mode, the preset value of the replacement data register 210 is output in lieu of the normal status data in response to a read request for a predetermined address from the microprocessor. In this way, an abnormal status, which would never occur in a normal state, is produced to perform debugging in such a state.

Accordingly, it is possible to produce a state in which the set value of the status data is replaced due to a hardware failure.

In the preferred embodiment, mask data for designating a replacement bit is stored in the mask setting register 220. This enables replacement of only a certain mask bit in bit units.

In the preferred embodiment, various replacements of the status in bit units (output of "0", output of "1", inversion of a signal, or output of an original signal) due to the employment of the replacement data register 210 and the mask setting register 220. In this manner, an abnormal status, which would never occur in a normal state, may be flexibly produced, and debugging may be performed under such a status.

In the preferred embodiment, the address of the replacement status register is stored in the comparison-address register 240. The address comparator 23 compares the address set in the comparison address register 240 with the address designated by the microprocessor and outputs the comparison result as a match detection signal to the second selector 22. Therefore, the status data of only a predetermined address is replaced.

The test mode register 230 is a register for setting a test enable signal determining whether or not to replace the status data. The test mode is set when predetermined data is input to this register. Therefore, normal operation is performed unless the test mode is set.

The above embodiment may be modified as described below.

In the preferred embodiment, the status data of the status register space 500 is replaced. However, the present invention is not limited to the status register as long as the register space can be seen from the microprocessor. For example, the present invention is applicable to a control register space and an internal memory space. Accordingly, although a predetermined setting is performed at a certain address, it is possible to reproduce a state in which a set value is replaced due to a hardware failure.

In the preferred embodiment, the status data is replaced at a predetermined address ("05h"). However, the present invention is not limited to one address. For example, a plurality of comparison address registers 240 may be used to sequentially compare addresses recorded in the comparison address register 240. This enables a state in which a plurality of set values have been replaced to be produced.

Furthermore, an address comparator 23 may be provided for each of the plurality of comparison address registers 240. This enables parallel address comparison. Thus, replacement would be performed without lowering the processing speed.

Figure 3:
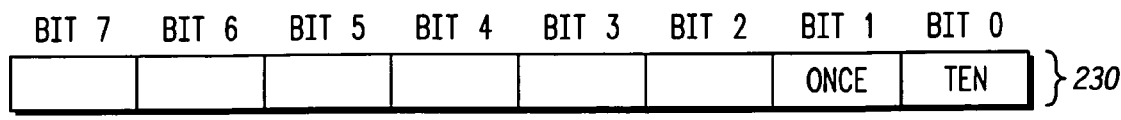
FIG. 3 is a schematic diagram showing a test mode register.

In the above embodiment, the mode is switched to the test mode by writing "01h" to the test mode register 230. A bit representing continuity of a test enable bit operation may be added. Specifically, the test mode register 230 may have the configuration shown in FIG. 3. Bit 0 is the bit that sets the test mode, and bit 1 is a ONCE bit indicating continuity of the test enable bit operation. The replacement or inversion operation is performed only once when the ONCE bit is set at "1", and the replacement or inversion operation is performed always when set at "0". Accordingly, bit 0 is set to "0" when the replacement operation has been performed. This enables the replacement operation to be performed once so that various states may be flexibly produced.

The number of replacement operations that are performed may be determined using bit 1 to bit 7. In this case, the data of bit 1 to bit 7 is subtracted whenever a replacement operation is performed. Then, the test mode ends when becoming "ALL0". The normal status is output as the final status data. This enables any number of replacement operations to be performed.

The present examples and embodiments are to be considered as illustrative and not restrictive, and the invention is not to be limited to the details given herein, but may be modified within the scope and equivalence of the appended claims.

What is claimed is:

1. A semiconductor integrated circuit connected to a microprocessor and including an externally settable test mode register, a replacement data register, a mask setting register, and a comparison address register, the semiconductor integrated circuit comprising:
    a first selection means for selecting register data recorded in register space based on an input address from the microprocessor;
    an address comparator for detecting a match between the input address and an address recorded in the comparison address register; and
    a second selection means for selecting a subject bit with the mask setting register and the replacement data register when a test mode is set by the test mode register and a match detection signal is output from the address comparator, and outputting final register data generated by executing a bit data change operation on normal register data.

2. The semiconductor integrated circuit according to claim 1, wherein the bit data change operation includes inverting a signal or replacing a predetermined value based on the data recorded to the mask setting register and the replacement data register.

3. The semiconductor integrated circuit according to claim 1, wherein:
    the test mode register further records bit data for setting the number of the bit data change operations; and
    the second selection means outputs the final register data in accordance with the number of bit data change operations.

4. The semiconductor integrated circuit according to claim 1, wherein the comparison address register includes a plurality of registers, the bit data change operations being performed for a plurality of addresses recorded in the registers.

5. The semiconductor integrated circuit according to claim 1, wherein the register data is status data recorded a status register.

* * * * *